METHOD OF PRODUCING SEMICONDUCTOR DEVICES
BY EMPLOYING VITREOUS MATERIAL
Filed Dec. 14, 1962

United States Patent Office 3,303,068

Patented Feb. 7, 1967

3,303,068

METHOD OF PRODUCING SEMICONDUCTOR DEVICES BY EMPLOYING VITREOUS MATERIAL

William Joseph Scott, Rugby, England, assignor to Associated Electrical Industries Limited, London, England, a British company Filed Dec. 14, 1962, Ser. No. 244,685
Claims priority, application Great Britain, Dec. 27, 1961, 46,290/61
9 Claims. (Cl. 148—177)

This invention relates to rectifiers or other non-linear devices which employ a body of refractory semi-conductor material having at least one p-n junction formed therein. In particular the invention relates to a method of forming such a device by which the edge of the, or each, p-n junction in the body is protected from contamination.

Semi-conductor devices of the kind with which the invention is concerned have heretofore been encapsulated in a sealed casing to protect the body of semi-conductor material, and particularly the exposed edge of the p-n junction which comes to the surface of the body, from atmospheric or other contamination. It is an object of the present invention to provide protection on the edge of the, or each, p-n junction of a semi-conductor device, which replaces or supplements the protection provided by the casing.

In accordance with the present invention, a method of producing a rectifier or other non-linear device which employs a body of refractory semi-conductor material includes the steps of hermetically sealing with vitreous material the peripheral edge of the body at least adjacent to one face thereof, and covering said face with a suitable impurity activator which is caused to form an alloy with the semi-conductor material and form a p-n junction therein, whereby the peripheral boundary of the junction is sealed by the vitreous material. By this means, the peripheral boundary of the junction which is sealed by the vitreous material is protected against atmospheric or other contamination.

As the p-n junction is formed in the body after the sealing vitreous material has been applied thereto, and as the process employed to form the junction involves raising the temperature of the body, it is necessary for a vitreous material to be chosen which has a softening point higher than the temperature to which the material is raised during the formation of the junction. The vitreous material should also have a coefficient of thermal expansion which is substantially equal to that of the semi-conductor material.

By the expression "a refractory semi-conductor material" is meant a semi-conductor material, for example, silicon or germanium, which is capable of withstanding temperatures in the region of 800° C.

Figure 1:
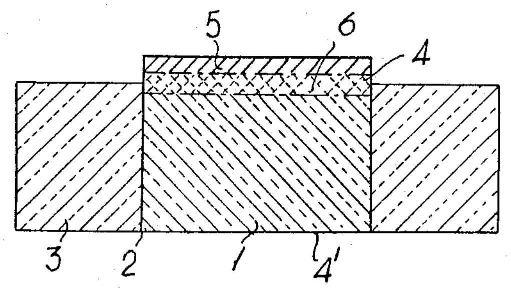
Figure 2:
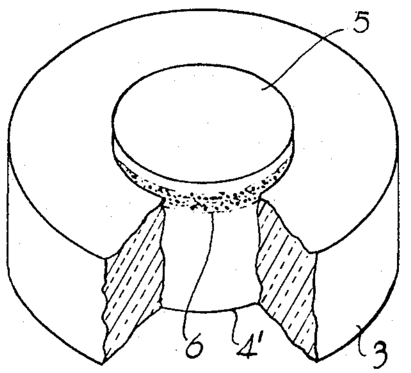

In order that the invention may be more readily understood, an embodiment thereof will now be described by way of example, with reference to the accompanying drawing, in which:

FIG. 1 shows a sectional elevation of a semi-conductor device formed in accordance with the present invention, and FIG. 2 is a perspective view of the semi-conductor device shown in FIG. 1, with a part of the vitreous material removed.

A semi-conductor rectifier or other non-linear device such as a transistor, which employs a body of the refractory semi-conductor material is formed by hermetically sealing the peripheral edge of the body at least adjacent to one face thereof with the vitreous material and then forming a p-n junction in the body so that the peripheral boundary of the junction is protected by the vitreous material.

When the body 1 of semi-conductor material is of cylindrical form as illustrated in the drawing, the peripheral surface is hermetically sealed with vitreous material conveniently by locating the body in an opening 2 formed in a mass of vitreous material 3 which is in the form of an annulus, and fusing the vitreous material to the semi-conductor material. Into one of the exposed faces 4 of the body is alloyed or diffused a suitable impurity activating material for example by the process of evaporation or by employing an atmosphere of suitable vapour, and the body of semi-conductor material is heated sufficiently for the activating vapour or material to enter into the body and form a p-n junction therein between regions of opposite conductivity type and/or conductivity.

If the body of semi-conductor material is of silicon having n-type conductivity, the activating material is conveniently aluminium, and on heating the body, the activating material alloys with the semi-conductor material and forms an alloy layer 5 and a p-n junction 6 which is below the surface of the body. Since the p-n junction is formed below the surface of the body and extends over the entire face of the body, the peripheral boundary of the junction is sealed and protected by the mass of vitreous material. Since the p-n junction is located immediately below the surface of one face of the body the vitreous material need only be provided adjacent that face and need not extend to the opposite face of the body.

It is essential that a vitreous material is chosen which has a softening point at a temperature higher than that to which the semi-conductor material is subjected during the formation of the junction, and it is also necessary for the vitreous material to have a coefficient of thermal expansion which is substantially the same as that of the semi-conductor material. For this purpose an aluminosilicate glass may be used. Such a glass readily wets the semi-conductor material and has a thermal expansion coefficient which is sufficiently close to that of either germanium or silicon to ensure that the joint made by fusion between the glass and the semi-conductor material will not crack when cooled to room temperature.

If desired, a further p-n junction can be formed in the body by introducing activating material into the other exposed face 4′ of the body, or alternatively, an ohmic contact could be made to this face in the normal manner.

The layer of oxide of the semi-conductor material, which forms on the surface during the sealing process, promotes adhesion between the vitreous material and the semi-conductor body. If desired, a more uniform, thicker coating of oxide may be formed on the peripheral surface of the body in a separate operation prior to the sealing of this surface with the vitreous material. In addition to promoting adhesion, the oxide coating also serves as a barrier when the semi-conductor material and the vitreous material are chemically incompatible.

Although in the arrangements shown the vitreous material is in the form of a block which is large compared with the body of semi-conductor material, the vitreous material need only be in the form of a thin layer to hermetically seal the peripheral surface of the body, and it may act as a cement between the semi-conductor material and a refractory insulating member.

In an alternative vapour process the activating material covering the exposed face 4 of the semi-conductor body may be in the form of a vapour which may be carride in a gas and diffused into the silicon to form the p-n junction 6 below the surface and covered by the vitreous mass 3.

This method is particularly convenient when a multiplicity of units is to be formed on one wafer which may be cut up into the individual elements after the forming of the junctions.

What I claim is:

1. A method of producing a device which employs a body of refractory semi-conductor material comprising hermetically sealing a peripheral face of the body at least adjacent an edge thereof with a vitreous material and subsequently doping a face of the material adjacent said edge with an impurity and heating the semi-conductor material to form a p-n junction in the material, whereby the boundary of the junction is sealed by the vitreous material.

2. A method of producing a device which employs a body of refractory semi-conductor material comprising hermetically sealing a peripheral face of the body at least adjacent an edge thereof with a vitreous material and subsequently doping a face of the material adjacent said edge with an impurity and heating the semi-conductor material to form a p-n junction in the material, whereby the boundary of the junction is sealed by the vitreous material, said vitreous material having a softening point at a temperature higher than that to which the semi-conductor material is subjected during the formation of the junction.

3. A method of producing a device which employs a body of refractory semi-conductor material comprising hermetically sealing a peripheral face of the body at least adjacent an edge thereof with a vitreous material and subsequently doping a face of the material adjacent said edge with an impurity and heating the semi-conductor material to form a p-n junction in the material, whereby the boundary of the junction is sealed by the vitreous material, said vitreous material having a coefficient of thermal expansion which is substantially the same as that of the semi-conductor material.

4. A method of producing a device which employs a body of refractory semi-conductor material comprising hermetically sealing a peripheral face of the body at least adjacent an edge thereof with a vitreous material and subsequently doping a face of the material adjacent said edge with an impurity and heating the semi-conductor material to form a p-n junction in the material, whereby the boundary of the junction is sealed by the vitreous material, said vitreous material having a softening point at a temperature higher than that to which the semi-conductor material is subjected during the formation of the junction, said vitreous material having a coefficient of thermal expansion which is substantially the same as that of the semi-conductor material.

5. A method of producing a device which employs a wafer of refractory semi-conductor material which comprises selecting a semi-conductor material which has two major parallel faces and a peripheral face, then covering said peripheral face with vitreous mateiral, at least adjacent one of said parallel faces, and subsequent to said covering of said end face with vitreous material covering said one of said parallel faces with a donor impurity to create a p-n junction in said semi-conductor material whereby said junction is sealed at its edge by said vitreous material.

6. A method of manufacturing a device which employs a body of refractory semi-conductor material of one conductivity characteristic and having two-end faces and an outer edge, the step of fusing vitreous material with a thermal expansion coefficient substantially the same as that of the semi-conductor material onto the outer edge of the body whereby a layer of oxide is formed on said body and the vitreous material is fused onto said layer of oxide to hermetically seal said outer edge, covering said one end face with an impurity material, and subsequently heating the semi-conductor and impurity material whereby said impurity material is alloyed with the semi-conductor material to render a part of the body of opposite conductivity characteristic to the remaining part of the body and form a junction between said parts in the body below the surface of said end face with the edge of the junction extending to the edge of the body beneath the vitreous material.

7. A method of manufacturing a device which employs a body of refractory semi-conductor material of one conductivity characteristic and having two-end faces and an outer edge, the step of fusing vitreous material with a thermal expansion coefficient substantially the same as that of the semi-conductor material onto the outer edge of the body whereby a layer of oxide is formed on said body and the vitreous material is fused onto said layer of oxide to hermetically seal said outer edge, covering said one end face with an impurity material, and subsequently heating the semi-conductor and impurity material whereby said impurity material is alloyed with the semi-conductor material to render a part of the body of opposite conductivity characteristic to the remaining part of the body and form a junction between said parts in the body below the surface of said end face with the edge of the junction extending to the edge of the body beneath the vitreous material, said vitreous material having a softening point at a temperature higher than that to which the semi-conductor material is subjected during the formation of the junction.

8. A method of manufacturing a device which employs a body of refractory semi-conductor material of one conductivity characteristic and having two end faces and an outer edge, the step of oxidizing said outer edge of the body to provide a layer of oxide of the semi-conductor material thereon, applying a vitreous material with a thermal expansion coefficient substantially the same as that of the semi-conductor material onto said layer of oxide and fusing the vitreous material to hermetically seal said outer edge, subsequently covering said end face with an impurity material, heating said impurity and semi-conductor material whereby said impurity material is alloyed with the semi-conductor material to render a part of the body of opposite conductivity characteristic to the remaining part of the body and form a junction between said parts in the body below the surface of said end face with the edge of the junction extending to the edge of the body beneath the vitreous material.

9. A method of manufacturing a rectifier which employs a body of silicon of "n" type conductivity and having two generally parallel end faces and an outer edge, said method comprising fusing an alumino-silicate glass around the outer edge of the body at least adjacent one end face thereof to hermetically seal said outer edge, then covering said end face with a layer of aluminum and subsequently alloying said aluminum with the silicon to render a part of the body of "p" type conductivity to form a junction between said "p" and "n" parts in the body below the surface of said end face with the edge of the junction extending to the edge of the body beneath the glass.

References Cited by the Examiner

UNITED STATES PATENTS

| | | | |
|---|---|---|---|
| 2,798,189 | 7/1957 | Alexander | 148—1.5 |
| 2,913,358 | 11/1959 | Harrington et al. | 148—1.5 |
| 2,930,722 | 3/1960 | Ligenza | 148—1.5 |
| 3,041,710 | 7/1962 | Geer | 29—195 |

HYLAND BIZOT, *Primary Examiner.*

DAVID L. RECK, *Examiner.*

R. O. DEAN, *Assistant Examiner.*